(12) United States Patent
Yamazaki

(10) Patent No.: US 7,618,869 B2
(45) Date of Patent: Nov. 17, 2009

(54) MANUFACTURING METHOD FOR INCREASING PRODUCT YIELD OF MEMORY DEVICES SUFFERING FROM SOURCE/DRAIN JUNCTION LEAKAGE

(75) Inventor: Yasushi Yamazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 3 days.

(21) Appl. No.: 11/598,644

(22) Filed: Nov. 14, 2006

(65) Prior Publication Data

US 2008/0111196 A1 May 15, 2008

(30) Foreign Application Priority Data

Nov. 14, 2005 (JP) .............................. 2005-328609

(51) Int. Cl.
*H01L 27/088* (2006.01)
*H01L 21/336* (2006.01)
(52) U.S. Cl. ............... 438/305; 257/368; 257/E21.409; 257/E27.06

(58) Field of Classification Search ................. 438/305; 257/368, E27.06, E21.409
See application file for complete search history.

(56) References Cited

U.S. PATENT DOCUMENTS

2002/0079580 A1 * 6/2002 Matsumura ................. 257/748

FOREIGN PATENT DOCUMENTS

JP 11-340436 12/1999

* cited by examiner

*Primary Examiner*—Matthew Smith
*Assistant Examiner*—Walter H Swanson
(74) *Attorney, Agent, or Firm*—McGinn IP Law Group, PLLC

(57) ABSTRACT

A DRAM device includes contact pads having a bottom in contact with a corresponding source/drain region 21 and a top in contact with a bottom of an overlying contact plug. The source/drain region has a recess caused by misalignment of the contact pad with respect to the source/drain region, the recess causing division of the original source/drain region. An additional diffused region is formed by ion-implantation to couple the divided source/drain region to reduce the junction leakage current flowing across the source/drain region.

15 Claims, 5 Drawing Sheets

MANUFACTURING METHOD FOR INCREASING PRODUCT YIELD OF MEMORY DEVICES SUFFERING FROM SOURCE/DRAIN JUNCTION LEAKAGE

BACKGROUND OF THE INVENTION (a) Field of the Invention

The present invention relates to a semiconductor device having a contact pad and, more particularly, to an improvement in the semiconductor device having the contact pad in contact with the source/drain regions. The present invention also relates to a method for manufacturing such a semiconductor device.

(b) Description of the Related Art

Along with development of finer patterns in a semiconductor device, the planar size of the semiconductor device has been remarkably reduced, and the thickness of the interlevel dielectric film has become larger. This results in an increase of the aspect ratio of contact holes used for receiving therein contact plugs in contact with the source/drain regions, and a reduction in an alignment margin during forming the contact holes. A smaller alignment margin makes it difficult to form the contact plug at a desired location of the source/drain regions.

In a memory device, such as a DRAM, a smaller size of memory cells reduces the pitch of gate electrodes, and accordingly reduces the area of the diffused region of the memory cell exposed from the gate electrodes.

Thus, there arises a problem that misalignment occurs in the semiconductor device between a contact hole having a smaller diameter and a corresponding diffused region of the memory cell, whereby a defective electric contact may occur in the semiconductor device.

As a countermeasure for solving the above problem, a self-alignment process is known wherein a contact pad to be in contact with an overlying contact plug and having a larger top surface is formed in self-alignment with the gate electrode for the diffused region, instead of embedding a conductive material in the contact hole to form the contact plug. This technique is described in JP-11(1999)-340436A.

The technique for forming the contact pad in self-alignment with the gate electrode uses a patterning step for patterning a conductive film on the semiconductor substrate to configure the contact pad, thereby facilitating formation of a suitable contact between the contact pad and the diffused region. In addition, the larger top surface of the contact pad increases an alignment margin during forming an overlying contact hole, thereby facilitating the connection between the contact pad and the overlying contact plug.

However, there is a problem in the above self-alignment technique that the peripheral area of the diffused region may be exposed from the contact pad due to misalignment of the mask pattern with respect to the source/drain diffused regions during patterning of the conductive material on the semiconductor substrate. This misalignment may cause, as shown in FIG. 6, occurring of a recess 25 in the diffused region 21 during the patterning to form the contact pad 22, wherein the recess 25 may divide the diffused region 21 formed on the semiconductor substrate 11.

The diffused region 21 and the substrate region of the semiconductor substrate 11 generally configure therebetween a p-n junction 31, across which a reverse bias voltage is applied for electric isolation during operation of the resultant semiconductor device. The recess 25 dividing the diffused region 21 may prevent a suitable reverse bias voltage from being applied across the p-n junction, causing an undesirable leakage current across the p-n junction. Thus, there may be a problem that the leakage current reduces the data retention time of the memory cell.

SUMMARY OF THE INVENTION

In view of the above problem in the conventional technique, it is an object of the present invention to provide a semiconductor device which is capable of suppressing the leakage current flowing across the p-n junction in the vicinity of the recess formed in the diffused region.

It is another object of the present invention to provide a method for manufacturing the semiconductor device of the present invention as described above.

The present invention provides a semiconductor device including: a plurality of MISFETs each including source/drain regions and a gate electrode structure; and a plurality of contact pads each in contact with a corresponding one of the source/drain regions through a space between adjacent two of the gate electrode structures, wherein the source/drain regions each includes therein an additional doped region doped with impurities in self-alignment with a corresponding one of the contact pads.

The present invention also provides a method for manufacturing a semiconductor device including: forming a plurality of gate electrode structures overlying a semiconductor substrate; implanting impurities into a portion of the semiconductor substrate to form source/drain regions in association with the gate electrode structures; depositing a conductive film on the source/drain regions by a self-alignment process using the gate electrode structures as a mask; patterning the conductive film by using a photoresist mask pattern to form a plurality of contact pads each in contact with a corresponding one of the source/drain regions; and introducing impurities into a portion of the source/drain regions by a self-alignment process using the contact pads as a mask.

In accordance with the present invention, introduction of impurities by a self-alignment process using the gate electrode structures as a mask to form an additional doped region allows the divided source/drain regions, if any, to be coupled together by the additional doped region, whereby the leakage current flowing across the p-n junction due to the presence of the divided source/drain regions can be prevented.

The above and other objects, features and advantages of the present invention will be more apparent from the following description, referring to the accompanying drawings.

PREFERRED EMBODIMENT OF THE INVENTION

Figure 1:
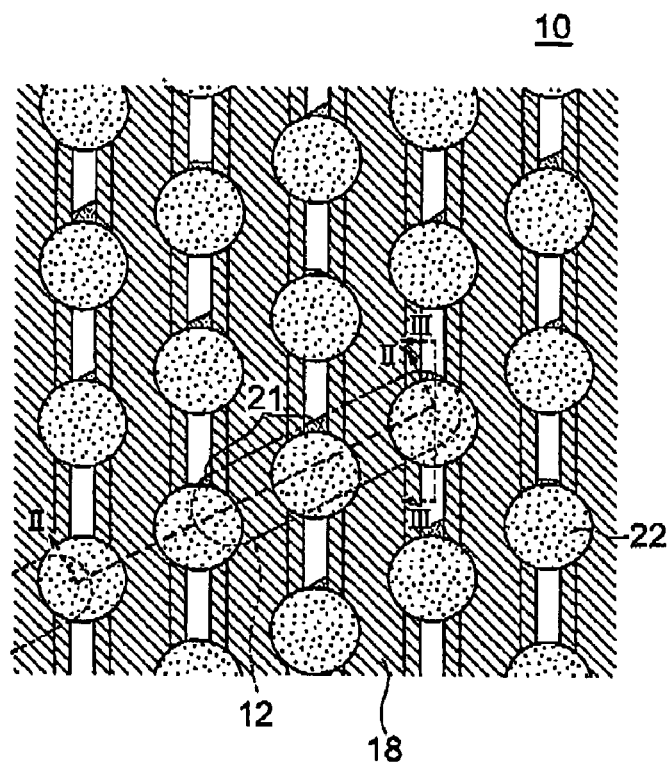
FIG. 1 is a top plan view of a semiconductor device according to a first embodiment of the present invention.

Now, the present invention is more specifically described with reference to accompanying drawings, wherein similar constituent elements are designated by similar reference numerals throughout the drawings.

Figure 2:
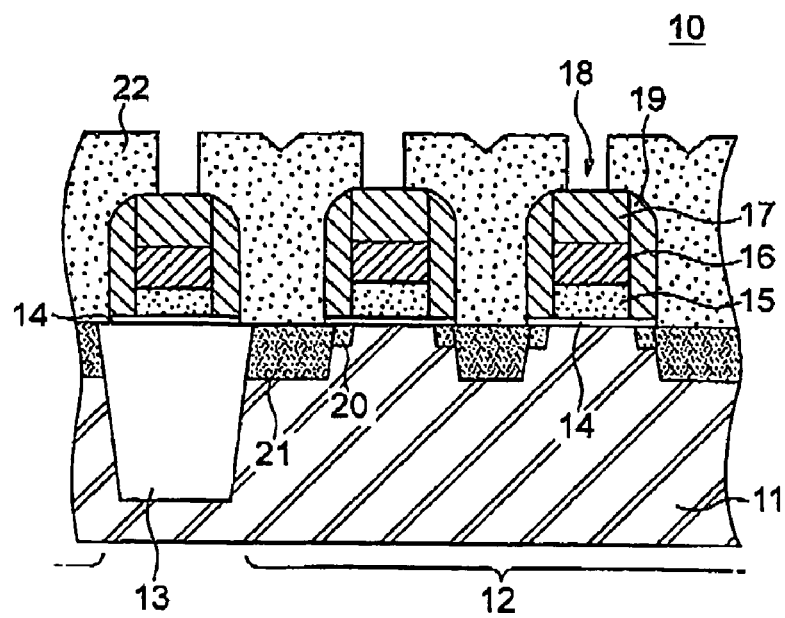
FIG. 2 is a sectional view taken along line II-II in FIG. 1.
Figure 3:
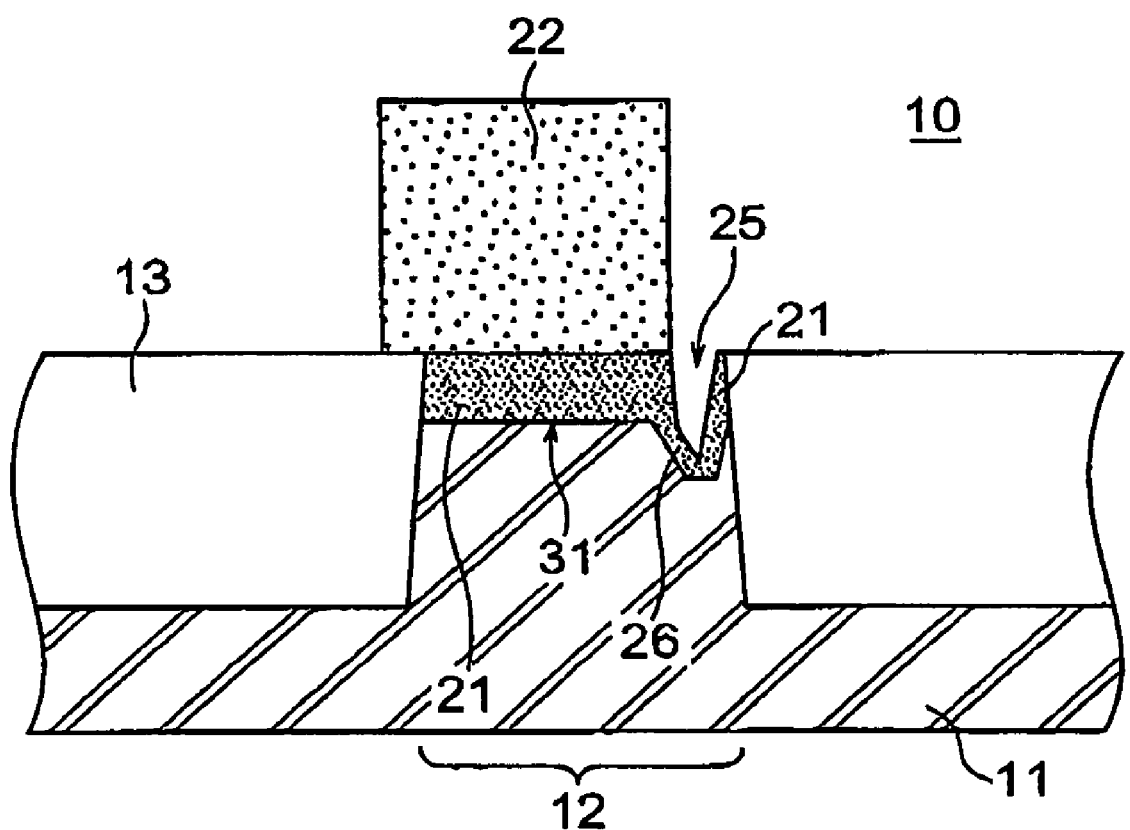
FIG. 3 is a sectional view taken along line III-III in FIG. 1.

FIG. 1 shows a top plan view of a semiconductor device according to a first embodiment of the present invention. FIGS. 2 and 3 show sectional views taken along lines II-II and III-III, respectively, in FIG. 1. With reference to these figures, the semiconductor device, generally designated by numeral 10, of the present embodiment is configured as a DRAM device formed on a silicon substrate 11. An element isolation region 13 is formed on the surface portion of the silicon substrate 11 by using a shallow-trench-isolation technique to thereby isolate device areas 12 from one another. In the device areas 12, p-type impurities are introduced in the silicon substrate 11 to configure a well region including a channel region, although not specifically shown in those figures.

As shown in FIG. 2, a 7-nm-thick gate insulation film 14 is formed on the device areas of the silicon substrate 11, and gate electrode structures 18 each having a gate electrode, an overlying silicon nitride (SiN) protective film 17 and a SiN sidewall spacer 19 are formed on the gate insulation film 14. The gate electrode includes a polysilicon film 15 and an overlying tungsten silicide (WSi) film 16.

In the device areas 12, the surface portion of the silicon substrate 11 exposed from the gate electrode structures 18 is configured as n-type heavily-doped diffused regions 21, which are referred to as n+ diffused regions 21 hereinafter. The n+ diffuse regions 21 are associated with a corresponding n-type lightly-doped diffused region 20, which may be referred to as n− diffused region or LDD region 20. Each device area 12 includes three n+ diffused regions 21 configuring a single central source region and two peripheral drain regions, as shown in FIG. 2.

Contact pads 22, each of which has a bottom surface in contact with a portion of one of the n+ diffused regions 21 exposed from the gate electrode structures 18 and a top surface overhanging a portion of the gate electrode structures 18, are formed in self-alignment with the gate electrode structures 18. The contact pads 22 are configured from doped polysilicon, which is doped with phosphor and has a thickness of around 200 nm.

In FIG. 3, there is shown one of the contact pads 22 which is misaligned with respect to the n+ diffused region 21. The misalignment causes the occurrence of a recess 25 on the surface of the n+ diffused region 21 due to the etching of the surface of the silicon substrate 11. The recess 25 may have a depth larger than the depth of the n+ diffused region 21, as exemplified in FIG. 3, thereby dividing the original n+ diffused region 21 into two parts. In the configuration of the present embodiment however, the recess 25 is associated with an additional n+ diffused region 26 overlapping the original n+ diffused region 21, whereby the divided n+ diffused regions shown in FIG. 3 are coupled together by the additional n+ diffused region 26.

Although not shown in FIGS. 2 and 3, an interlevel dielectric film is formed on the gate electrode structures 18 and the contact pads 22, and overlying contact plugs penetrate the interlevel dielectric film to be in contact with the top surface of the contact pads 22. Those contact plugs are connected to overlying interconnects or cell capacitors as in the conventional DRAM device.

In the configuration of the present embodiment, the additional n+ diffused region 26 connects together the divided n+ diffused regions 21 divided by the recess 25, thereby allowing a suitable reverse bias voltage to be applied across the p-n junction in the vicinity of the recess 25. This prevents the junction leakage current from flowing across the p-n junction in the vicinity of the recess 25, thereby assuring the normal operation of the DRAM device 10.

Figure 4A:
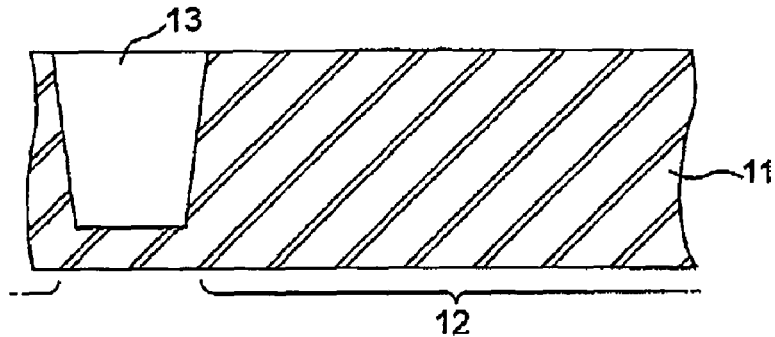
FIGS. 4A to 4E are sectional views showing consecutive steps in fabrication of the semiconductor device of FIG. 1.

FIGS. 4A to 4E show fabrication steps of the semiconductor device of the above embodiment. These figures correspond to the section taken along line II-II, similarly to FIG. 2. An element isolation region 13 having a STI structure is first formed on the surface portion of the silicon substrate 11, as shown in FIG. 4A, thereby defining the device areas 12 in the silicon substrate 11.

Figure 4B:
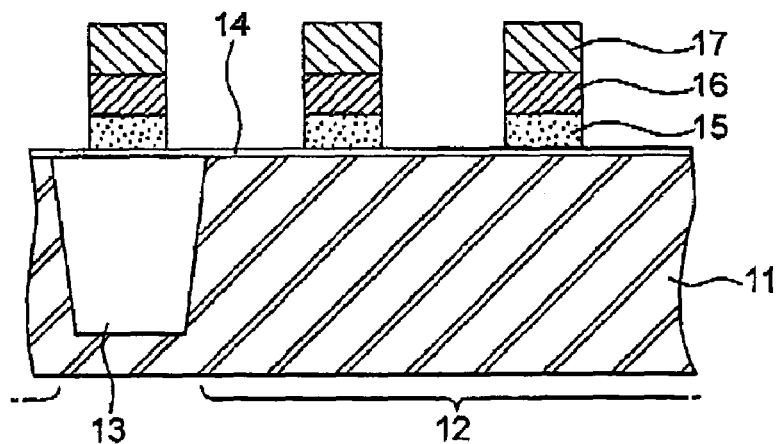

A gate insulation film 14 is formed on the silicon surface by using a thermal oxidation process, followed by consecutively forming thereon a polysilicon film 15, a WSi film 16 and a SiN film 17. The SiN film 17, WSi film 16 and polysilicon film 15 are then patterned using a photolithographic and etching technique, thereby forming the gate electrode and overlying protective film 17, as shown in FIG. 4B. Impurities are then introduced in the device areas 12 for forming a well region (not shown) including the channel region for the MISFETs.

Subsequently, ion-implantation process is conducted to introduce phosphor into a surface portion of the device area 12 at an acceleration energy of 20 KeV and a dosage of $10^{13}$ cm$^{-2}$ by using the gate electrode 15, 16 and the protective film 17 as a mask. A 30-nm-thick SiN film is then deposited over the entire area, and etched back using a dry etching technique, to thereby form a sidewall spacer 19 on the gate electrode structures 18 and remove a portion of the gate insulation film 14 exposed from the sidewall spacer 19.

Figure 4C:
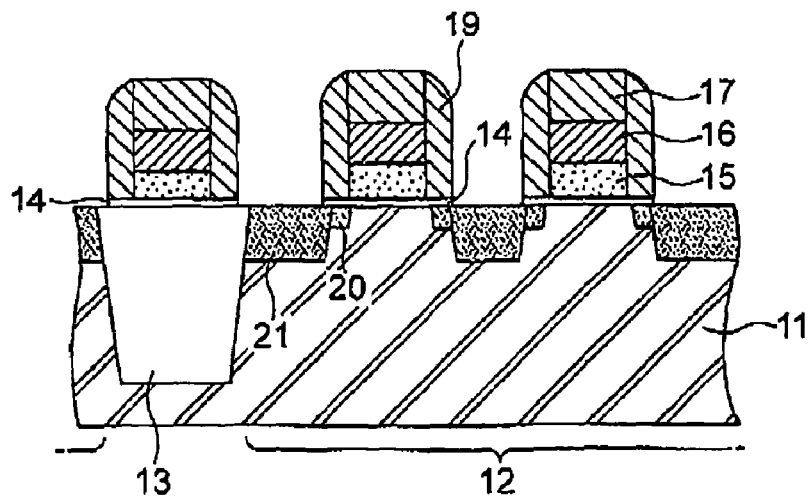
Figure 4D:
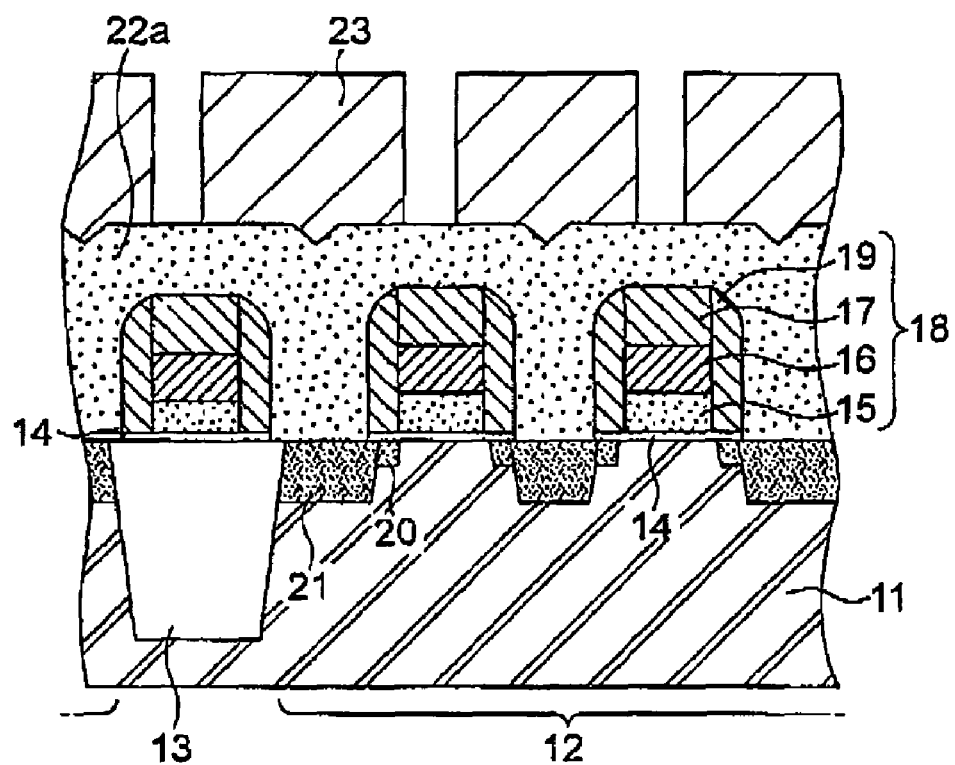

Another ion-implantation process is then conducted for implanting phosphor into a portion of the device area at an acceleration energy of 40 KeV and a dosage of $10^{13}$ cm$^{-2}$ by using the gate electrode structures 18 including the sidewall spacer 19 as a mask. A thermally annealing process is then conducted at a temperature of 800 degrees C. for around 10 minutes, thereby activating the implanted impurities to configure the n− diffused regions 20 and n+ diffused regions 21, as shown in FIG. 4C.

Figure 4E:
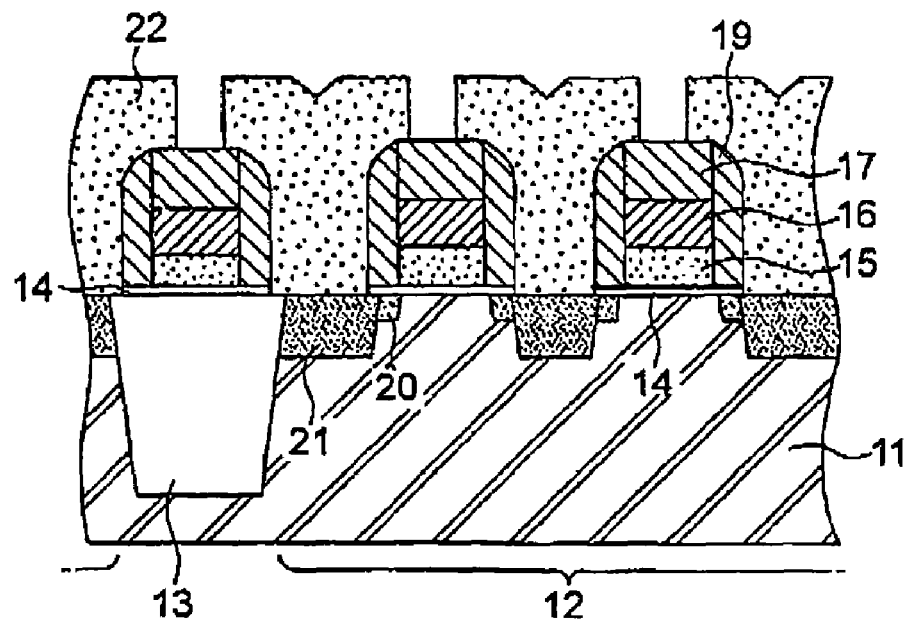

A CVD process is then conducted to form a 200-nm-thick polysilicon film, i.e., doped polysilicon (DOPOS) film 22a, doped with phosphor at a dosage of $2 \times 10^{20}$ cm$^{-2}$. The CVD process uses a self-alignment process to deposit the DOPOS film 22a in the space between adjacent two of the gate electrode structures 18, thereby using the gate electrode structures 18 as a deposition mask. The DOPOS film 22a is then patterned by a photolithographic and dry etching process using a photoresist mask 23 as an etching mask, thereby forming contact pads 22. Thereafter, the photoresist mask 23 is removed from the surface of the contact pads 22, as shown in FIG. 4E.

Figure 6:
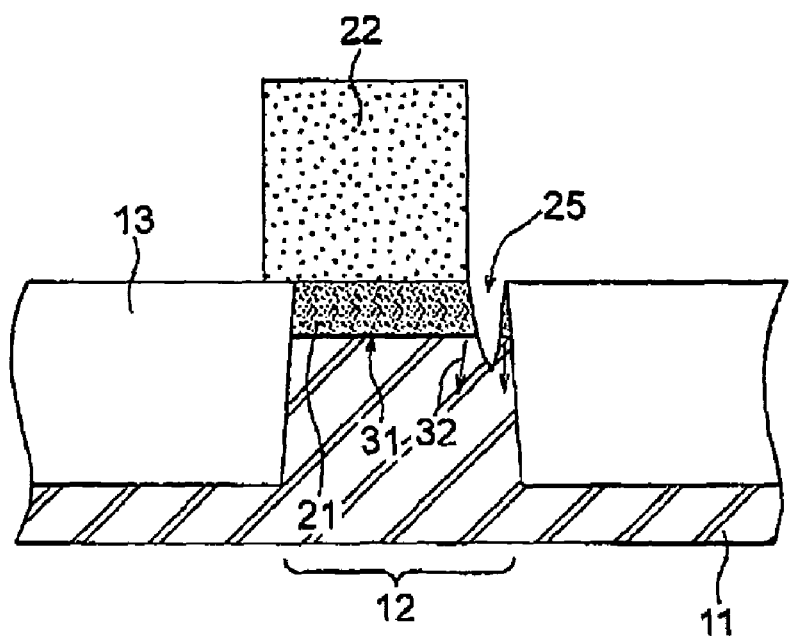
FIG. 6 is a sectional view of a conventional semiconductor device in a step of fabrication thereof.

The patterning for the contact pads 22 may incur misalignment of the photoresist mask 23 with respect to the source/drain diffused regions 21, whereby a peripheral portion of the device area 12 exposed from the photoresist mask 23 has therein a recess, such as 25 shown in FIG. 6.

Subsequently, an additional ion-implantation process is conducted to implant phosphor into the surface portion of the silicon substrate 11, thereby introducing phosphor into the diffused regions 21 including the recess 25, if any, at a dosage of around $5 \times 10^{12}$ cm$^{-2}$. A thermally annealing process is then conducted at a temperature of above 750 degrees C. to activate the introduced impurities, thereby obtaining the additional n+ diffused region 26 for connection of the divided diffused regions 21.

An interlevel dielectric film (not shown) is then deposited over the entire area including the contact pads 22, followed by patterning the interlevel dielectric film to form therein through-holes exposing therethrough the top surface of the contact pads 22. Contact plugs are then formed to fill the through-holes and to contact the exposed top surface of the contact pads 22. Another interlevel dielectric film, overlying interconnect lines and capacitors are then formed to complete the DRAM device.

It is to be noted that the additional n+ diffused region 26 for connection of the divided diffused regions 21 may be formed using other impurities such as As or Sb instead of phosphor.

For assuring the advantage of the present invention, samples of the present invention and comparative examples were manufactured for comparison therebetween in the product yield, which is generally defined by the ratio of the number of non-defective products to the number of total products. The structure of the comparative examples was similar to the structure of samples of the present invention except that the comparative examples did not have the additional n+ diffused region 26. The samples were superior to the comparative examples in the product yield by about 20%, thereby revealing the advantage of the present invention over the conventional technique.

Figure 5:
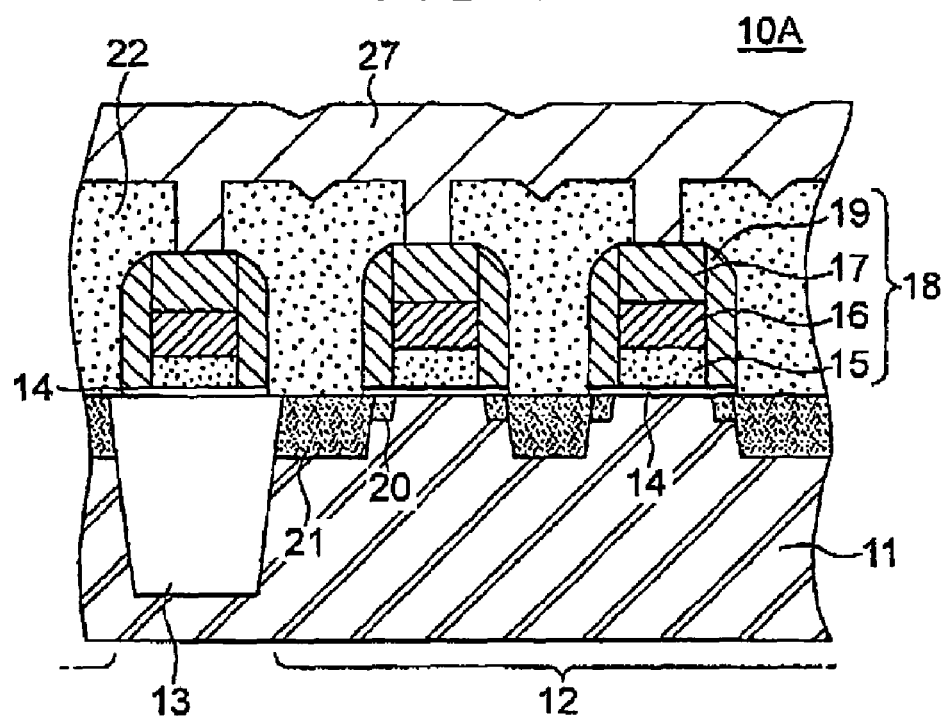
FIG. 5 is a sectional view of a semiconductor device according to a second embodiment of the present invention.

A semiconductor device of a second embodiment of the present invention is similar to the first embodiment except that the interlevel dielectric films receiving therein contact pads and contact plugs are made from phosphorous silicate phosphosilicate glass (PSG), and are hereinafter referred to as PSG films. FIG. 5 shows the semiconductor device 10A of the second embodiment in a fabrication step of the process therefor. FIG. 5 corresponds to the section taken along line II-II in FIG. 1.

In manufacture of the semiconductor device 10A of the present embodiment, a PSG film 27 is formed over the entire area after the step of FIG. 4E for patterning the contact pads 22. The PSG film 27 is then annealed at a temperature of above 750 degrees C. to solid-phase diffuse the phosphor received in the PSG film 27 toward the silicon substrate 11. The phosphor received in the PSG film 27 is thus diffused in a solid phase toward the surface portion of the silicon substrate 11 including the recess 25 and the vicinity thereof, thereby forming the additional n+ diffused region 26 for connection of the divided diffused regions 21.

The PSG film 27 is used in the present embodiment to receive therein the contact pads 22 and the contact plugs. By using the solid-phase diffusion of the phosphor received in the PSG film 27, the additional ion-implantation process after the patterning for the contact pads 22 is not needed for forming the additional n+ diffused region 26 for connection. This simplifies the process for the semiconductor device 10A of the second embodiment.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising:
    forming a plurality gate electrode structures overlying a semiconductor substrate;
    implanting impurities in a portion of said semiconductor substrate to form source/drain regions in association with said gate electrode structures;
    depositing a conductive film on said source/drain regions by self-alignment process using said gate electrode structures as a mask;
    patterning said conductive film by using a photoresist mask pattern to form a plurality of contact pads each in contact with a corresponding one of said source/drain regions,
    wherein a misalignment of said photoresist mask in said patterning forms a recess on said semiconductor substrate; and
    introducing impurities into a portion of said source/drain regions by a self-alignment process using said contact pads as a mask,
    wherein in said introducing impurities, said impurities are introduced only into said recess.

2. The method according to claim 1, wherein said introducing impurities includes implanting ions of said impurities into said portion of said semiconductor substrate.

3. The method according to claim 1, wherein said introducing impurities includes solid-phase diffusing impurities contained in an interlevel dielectric film covering said contact pads into said portion of said semiconductor substrate.

4. The method according to claim 1, wherein in said introducing impurities, said impurities are introduced into a recess of said semiconductor substrate formed by said patterning.

5. The method according to claim 4, wherein said impurities introduced in said introducing impurities include phosphor.

6. The method according to claim 1 wherein in said introducing impurities, said impurities are introduced only into a portion of said source/drain regions which is not in contact with said contact pads.

7. The method according to claim 1, wherein said portion of said source/drain regions is exposed from the photoresist mask pattern.

8. The method according to claim 1, wherein in said introducing impurities, said impurities are not introduced through said contact pads.

9. The method according to claim 1, wherein in said introducing impurities, said impurities do not pass through said implanted impurities.

10. The method according to claim 1, wherein a portion of an upper surface of said impurities introduced by said introducing impurities is exposed.

11. The method according to claim 1, wherein an exposed upper surface of said impurities introduced by said introducing impurities is not in contact with said implanted impurities.

12. The method according to claim 1, wherein an entire area of a lower surface of said implanted impurities is not in contact with said impurities introduced by said introducing impurities.

13. The method according to claim 1, wherein a portion of a lower surface of said implanted impurities is in contact with a surface portion of said semiconductor substrate.

14. A method for manufacturing a semiconductor device comprising:
    forming a plurality gate electrode structures overlying a semiconductor substrate;
    implanting impurities into a portion of said semiconductor substrate to form source/drain regions in association with said gate electrode structures;
    depositing a conductive film on said source/drain regions by a self-alignment process using said gate electrode structures as a mask;
    patterning said conductive film by using a photoresist mask pattern to form a plurality of contact pads each in contact with a corresponding one of said source/drain regions,
    wherein said patterning comprises an etching,
    wherein a misalignment in said patterning forms a recess by said etching on said semiconductor substrate; and
    introducing impurities into a portion of said source/drain regions by a self-alignment process using said contact pads as a mask, wherein said recess divides said implanted impurities into two parts, and wherein said introduced impurities couples together said divided implanted impurities.

15. A method of manufacturing a semiconductor device comprising:

forming a plurality of gate electrode structures overlying a semiconductor substrate;

implanting impurities into a portion of said semiconductor substrate to form source/drain regions in association with said gate electrode structures;

depositing a conductive film on said source/drain regions by a self-alignment process using said gate electrode structures as a mask;

patterning said conductive film by using a photoresist mask pattern and etching to form a plurality of contact pads each in contact with a corresponding one of said source/drain regions, wherein a misalignment in said patterning forms a recess by said etching on said semiconductor substrate, said recess dividing said implanted impurities into two separate parts; and introducing impurities into a portion of said source/drain regions by a self-alignment process using said contact pads as a mask, wherein said introduced impurities couple together said divided implanted impurities.

* * * * *